United States Patent
Jeong et al.

(10) Patent No.: US 11,563,417 B2
(45) Date of Patent: Jan. 24, 2023

(54) ACOUSTIC RESONATOR

(71) Applicant: Samsung Electro-Mechanics Co., Ltd., Suwon-si (KR)

(72) Inventors: Dae Hun Jeong, Suwon-si (KR); Sang Uk Son, Suwon-si (KR); Won Han, Suwon-si (KR); Jong Woon Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 1122 days.

(21) Appl. No.: 16/137,710

(22) Filed: Sep. 21, 2018

(65) Prior Publication Data

US 2019/0158057 A1    May 23, 2019

(30) Foreign Application Priority Data

Nov. 20, 2017 (KR) .................. 10-2017-0154968
Jun. 19, 2018 (KR) .................. 10-2018-0070149

(51) Int. Cl.
*H03H 9/02* (2006.01)
*H03H 9/13* (2006.01)
*H03H 9/17* (2006.01)

(52) U.S. Cl.
CPC ....... *H03H 9/0211* (2013.01); *H03H 9/02118* (2013.01); *H03H 9/13* (2013.01); *H03H 9/174* (2013.01)

(58) Field of Classification Search
CPC .... H03H 9/0211; H03H 9/02118; H03H 9/13; H03H 9/174
USPC ........................................ 333/133, 187, 188
See application file for complete search history.

(56) References Cited

U.S. PATENT DOCUMENTS

| | | |
|---|---|---|
| 2002/0079986 A1 | 6/2002 | Ruby et al. |
| 2004/0140869 A1 | 7/2004 | Marksteiner et al. |
| 2008/0296999 A1 | 12/2008 | Kido et al. |
| 2009/0206706 A1 | 8/2009 | Iwaki et al. |
| 2011/0298564 A1 | 12/2011 | Iwashita et al. |
| 2013/0147577 A1 | 6/2013 | Nishihara et al. |
| 2013/0314177 A1 | 11/2013 | Burak et al. |
| 2014/0125203 A1 | 5/2014 | Choy et al. |

(Continued)

FOREIGN PATENT DOCUMENTS

| | | |
|---|---|---|
| CN | 101395796 A | 3/2009 |
| CN | 102301590 A | 12/2011 |

(Continued)

OTHER PUBLICATIONS

Chinese Office Action dated Nov. 25, 2022, in counterpart Chinese Patent Application No. 201811375268.8 (14 pages in English, 9 pages in Chinese).

*Primary Examiner* — Rakesh B Patel
*Assistant Examiner* — Jorge L Salazar, Jr.
(74) *Attorney, Agent, or Firm* — NSIP Law

(57) ABSTRACT

An acoustic resonator includes: a substrate; a resonant region including a first electrode, a piezoelectric layer, and a second electrode disposed on the substrate, and a reflective layer disposed along a periphery of the resonant region; and a connection electrode extending from the second electrode. The reflective layer includes a second section disposed between the resonant region and the connection electrode, and a first section, and a cross-sectional area of the first section is different than a cross-sectional area of the second section.

18 Claims, 6 Drawing Sheets

(56) References Cited

U.S. PATENT DOCUMENTS

| | | |
|---|---|---|
| 2014/0203686 A1 | 7/2014 | Song et al. |
| 2015/0130559 A1 | 5/2015 | Yokoyama et al. |
| 2015/0326200 A1 | 11/2015 | Grannen et al. |
| 2016/0035960 A1 | 2/2016 | Lee et al. |
| 2017/0310303 A1* | 10/2017 | Thalhammer ...... H03H 9/02118 |

FOREIGN PATENT DOCUMENTS

| | | |
|---|---|---|
| JP | 5563739 B2 | 7/2014 |
| JP | 2015-95729 A | 5/2015 |
| JP | 5918522 B2 | 5/2016 |

* cited by examiner

II-II'

ACOUSTIC RESONATOR

CROSS-REFERENCE TO RELATED APPLICATIONS

This application claims the benefit under 35 USC 119(a) of Korean Patent Application Nos. 10-2017-0154968 filed on Nov. 20, 2017 and 10-2018-0070149 filed on Jun. 19, 2018, in the Korean Intellectual Property Office, the entire disclosures of which are incorporated herein by reference for all purposes.

BACKGROUND

1. Field

This application relates to an acoustic resonator.

2. Description of the Background

As wireless communication devices are becoming compact, there is ever-increasing demand for the miniaturization of high-frequency components. As an example, provided is a filter using a bulk acoustic wave (BAW) resonator employing semiconductor thin-film wafer manufacturing technology.

A bulk acoustic wave (BAW) resonator is a thin-film device exhibiting resonance using piezoelectric characteristics obtained through a piezoelectric dielectric material being deposited on a silicon wafer forming a semiconductor substrate.

A bulk acoustic wave (BAW) resonator has been applied to mobile communication devices, compact lightweight filters for chemical and biological devices, oscillators, resonant elements, acoustic resonant mass sensors, and the like.

Various structural shapes and functions are being researched, in order to enhance the characteristics and performance of bulk acoustic wave resonators. Accordingly, manufacturing methods are also being continuously researched.

The above information is provided as background information only to assist with an understanding of the present disclosure. No determination has been made, and assertion is made, as to whether any of the above might be applicable as prior art with regard to the disclosure.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An acoustic resonator includes a substrate; a resonant region including a first electrode, a piezoelectric layer, and a second electrode disposed on the substrate, and a reflective layer disposed along a periphery of the resonant region; and a connection electrode extending from the second electrode. The reflective layer includes a second section disposed between the resonant region and the connection electrode, and a first section, and a cross-sectional area of the first section is different than a cross-sectional area of the second section.

The first section and the second section may have a same thickness, and the second section includes a reference portion and a projection protruding from the reference portion toward a center of the resonant region.

The projection may protrude from the reference portion along a boundary between a resonant portion, which includes the resonant region, and the connection electrode.

The second section of the reflective layer may have a greater width than the first section of the reflective layer.

At least a portion of the reflective layer may be disposed between the first electrode and the piezoelectric layer.

The second electrode may have an end disposed within a reflective portion, which includes the reflective layer.

The reflective layer may be formed of a material different from a material of which the piezoelectric layer is formed.

The reflective layer may be laminated on a side of the second electrode that is opposite of the substrate.

The first section of the reflective layer may be laminated on the piezoelectric layer and may be disposed to be in contact with an end of the second electrode.

The reflective layer may be configured to have a first thickness in the first section that is different from a second thickness in the second section.

The reflective layer may be disposed between the piezoelectric layer and the second electrode.

The reflective layer may be configured to have a continuous annular shape.

The reflective layer may be formed of a material different from a material of which the piezoelectric layer is formed.

An acoustic resonator includes a substrate; and a resonant region including a first electrode, a piezoelectric layer, and a second electrode laminated on the substrate, and a reflective layer is disposed along a periphery of the resonant region in an annular shape. The reflective layer is disposed between the piezoelectric layer and the substrate, and the reflective layer includes a first section having a first width and a second section having a second width that is different than the first width.

The second section of the reflective layer may include a projection protruding toward a center of the resonant region.

An apparatus includes an acoustic resonator. The acoustic resonator includes a first electrode, a piezoelectric layer above the first electrode, a second electrode above the piezoelectric layer, a reflective layer disposed along a periphery of a resonant region in which the first electrode, the piezoelectric layer, and the second electrode are stacked, and a connection electrode extending from the second electrode, The reflective layer has a first width in a first section and a second width in a second section corresponding to a boundary between the connection electrode and the second electrode, and the first width is different than the second width.

The first section of the reflective layer is comprised of a first material, the second section of the reflective material is comprised of a second material, and the first material is different than the second material.

The periphery of the resonant region may be outside of the resonant region.

The connection electrode may be separate from the second electrode.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Hereinafter, examples of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

It will be apparent that though the terms first, second, third, and the like, may be used herein to describe various members, components, regions, layers and/or sections, these members, components, regions, layers and/or sections should not be construed as being limited by these terms. These terms are only used to distinguish one member, component, region, layer or section from another member, component, region, layer or section. Thus, a first member, component, region, layer or section discussed below could be termed a second member, component, region, layer or section without departing from the teachings of the embodiments.

It is noted that use of the term "may" herein with respect to an example or embodiment, for example, as to what an example or embodiment may include or implement, means that at least one example or embodiment exists where such a feature is included or implemented while all examples and embodiments are not limited thereto.

Figure 1:
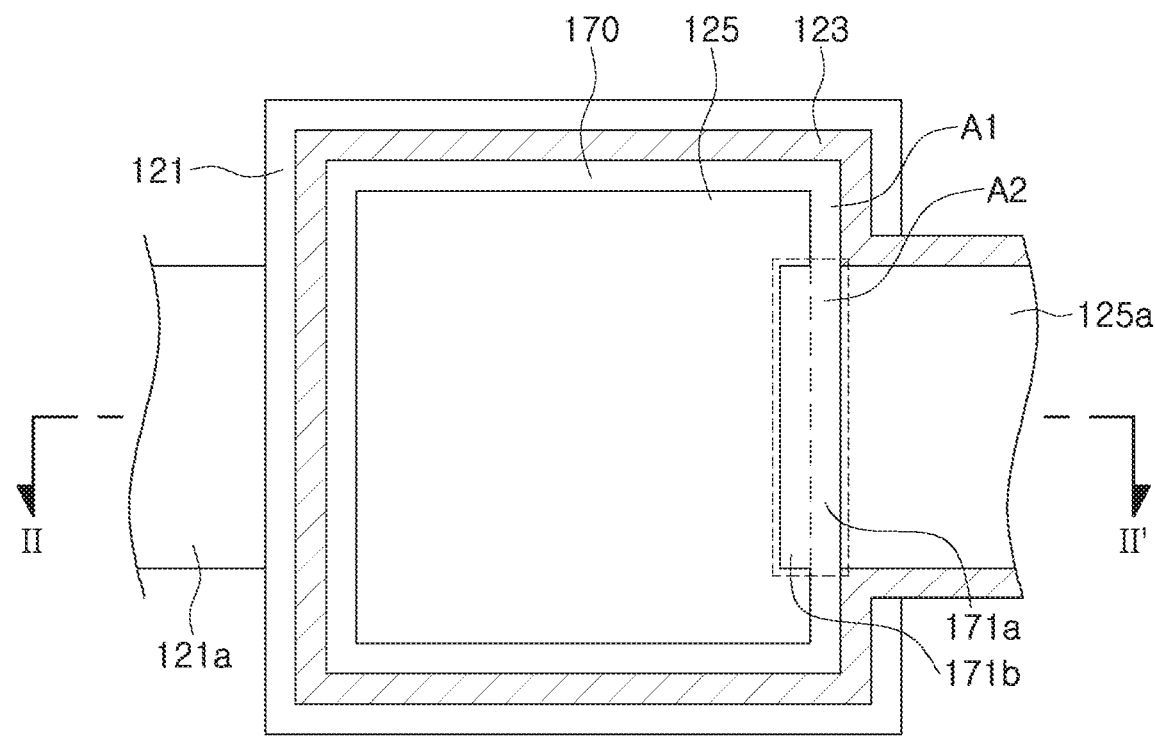
FIG. 1 is a plan view of an acoustic resonator according to an example.
Figure 2:
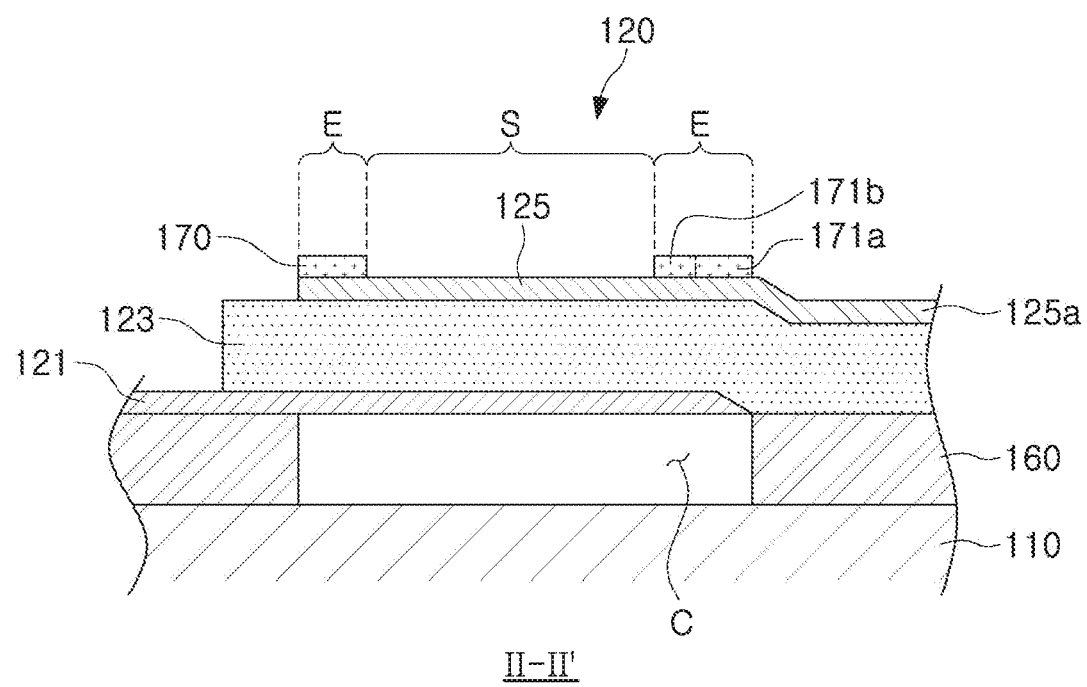
FIG. 2 is a cross-sectional view taken along line II-II' in FIG. 1.

FIG. 1 is a plan view of an acoustic resonator according to an example. For clarity of illustration, only a resonant portion is shown in FIG. 1. FIG. 2 is a cross-sectional view taken along line II-II' in FIG. 1.

Referring to FIGS. 1 and 2, an acoustic resonator 100 according to an example may be a bulk acoustic wave (BAW) resonator and may include a substrate 110, a resonant portion 120, and a support 160.

The substrate 110 may be a silicon substrate. For example, a silicon wafer or a silicon-on-insulator (SOI) substrate may be used as the substrate 110.

An insulating layer (not shown) may be provided on a top surface of the substrate 110 to electrically insulate the substrate 110 and the resonant portion 120 from each other.

The support 160 may be disposed on the substrate 110 such that the resonant portion 120 and the substrate 110 are spaced apart from each other. The support 160 may support an outer side of a resonant region S of the resonant portion 120. Thus, a cavity C may be formed between the resonant region S and the substrate 110.

The support 160 may be formed of a dielectric material, such as silicon oxide ($SiO_2$), aluminum nitride (AlN), aluminum oxide ($Al_2O_3$), silicon nitride (SiN), magnesium oxide (MgO), zirconium oxide ($ZrO_2$), lead zirconate titanate (PZT), gallium arsenide (GaAs), hafnium oxide ($HfO_2$), aluminum oxide ($Al_2O_3$), titanium oxide ($TiO_2$) or zinc oxide (ZnO). However, the dielectric material is not limited thereto.

The resonant portion 120 includes a first electrode 121, a piezoelectric layer 123, and a second electrode 125, sequentially disposed or stacked from bottom (substrate side) to top. That is, the piezoelectric layer 123 is disposed between the first electrode 121 and the second electrode 125.

The resonant portion 120 is provided on the support 160. As a result, the support 160, the first electrode 121, the piezoelectric layer 123, and the second electrode 125 are sequentially disposed or stacked on the substrate 110 to constitute the resonant portion 120.

The resonant portion 120 may resonate the piezoelectric layer 123 according to a signal applied to the first electrode 121 and the second electrode 125 to generate a resonance frequency and an antiresonance frequency.

The first electrode 121 and the second electrode 125 may be formed of a conductor. For example, the first electrode 121 and the second electrode 125 may be formed of gold (Au), molybdenum (Mo), ruthenium (Ru), iridium (Ir), aluminum (Al), platinum (Pt), titanium (Ti), tungsten (W), palladium (Pd), tantalum (Ta), chromium (Cr), nickel (Ni) or a metal including at least one thereof. However, the conductor is not limited thereto.

The second electrode 125 is disposed on the piezoelectric layer 123. In the present example, the resonant region S of the acoustic resonator 100 is defined as a region in which the second electrode 125, the piezoelectric layer 123, and the first electrode 121 are sequentially stacked.

The first electrode 121 and the second electrode 125 include connection electrodes 121a and 125a, which extend outwardly of the resonant portion 120 to be electrically connected to an external entity, respectively. Each of the connection electrodes 121a and 125a may be connected to another acoustic resonator disposed adjacent thereto.

The piezoelectric layer 123 may be disposed between the first electrode 121 and the second electrode 125.

Zinc oxide (ZnO), aluminum nitride (AlN), doped aluminum nitride, lead zirconate titanate, and quartz may be selectively used as a material of the piezoelectric layer 123. The doped aluminum nitride may further include a rare earth metal or a transition metal. As an example, the rare earth metal may include at least one of scandium (Sc), erbium (Er), yttrium (Y), and lanthanum (La). The transition metal may include at least one of hafnium (Hf), titanium (Ti), zirconium (Zr), tantalum (Ta), niobium (Nb), and magnesium (Mg).

The resonant portion 120 includes a reflective portion E.

The reflective portion E may be formed along the periphery of the resonant region S and may be defined as a portion configured to have a thickness different from that of the resonance region S by the reflective layer 170.

The reflective portion E is a portion extending from the resonant region S outwardly and refers to a region formed in a continuous annular shape along the periphery of the resonance region S. However, in another example, the reflective portion E may be formed in a discontinuous annular shape in which it is partially disconnected.

Accordingly, as shown in FIG. 2, reflective portions E are disposed at opposite ends of the resonant region S in a section in which the resonant portion 120 is cut to cross the resonant region S, respectively.

In the present example, the reflective layer 170 is disposed above the second electrode 125. However, the position of the reflective layer 170 is not limited thereto and the reflective layer 170 may be disposed below the second electrode 125. Similar to an example which will be described later, the reflective layer 170 may be disposed in various positions, such as below the piezoelectric layer 123, within the piezoelectric layer 123, and below the first electrode 121.

The acoustic resonator 100 may reflect a transversal elastic wave, which propagates from outside of the resonant portion, into the resonant region S using the reflective portion E to prevent loss of energy of the elastic wave. Thus, a high Q-factor may be obtained. The high Q-factor may enhance blocking characteristics of another frequency band in the case of implementing a filter with an acoustic resonator.

The reflective layer 170 may include a piezoelectric material, a dielectric material or a metal. For example, the reflective layer 170 may be formed of one of aluminum nitride (AlN), lead zirconate titanate (PZT), silicon oxide ($SiO_2$), titanium oxide ($TiO_2$), ruthenium (Ru), molybdenum (Mo), gold (Au), titanium (Ti), copper (Cu), tungsten (W), and aluminum (Al), or a synthetic material including any one thereof as a main ingredient.

In the present example, the reflective layer 170 is provided in an annular shape and includes into a second section A2 disposed along a boundary between the connection electrode 125a of the second electrode 125 and the resonant region S and a first section A1 disposed in a region other than a region is which the second section A2 is disposed.

In the second section A2, the reflective layer 170 includes a reference portion 171a extending with the same sectional area as the first section A1 and a projection 171b protruding toward the center of the resonant region from the reference portion 171a.

The projection 171b protrudes toward the resonant region S in such a manner as to expand a width of the reflective layer 170 within the range corresponding to the width of the connection electrode 125a of the second electrode 125.

Accordingly, the reflective layer 170 in the second section A2 has a width different from a width in the first section A1.

In the present example, the second section A2 is configured to have a greater width than the first section A1. However, their widths are not limited to the description. Various modifications may be made, such as forming the first section A1 and the second section A2 to have the same width, but with different materials.

The above configuration is conceived to enhance performance of the acoustic resonator, which will be described in detail below.

As shown in FIGS. 1 and 2, the second electrode 125 does not extend outwardly of the reflective layer 170 in a region in which the connection electrode 125a is not present, but is allowed to extend outwardly of the reflective portion E by the connection electrode 125a in a region in which the connection electrode 125a is disposed.

Accordingly, a stacked structure of the second electrode 125 and the reflective layer 170 in the first section A1 and the second section A2 is configured as an asymmetrical structure by the connection electrode 125a. In this case, the connection electrode 125a disposed outwardly of the reflective layer 170 also partially functions as a reflective portion E.

Consequently, in the case that the reflective layer 170 is configured to have the same structure in the first section A1 and the second section A2, the reflection of a transverse wave is different in the first section A1 and the second section A2. As a result, there is difficulty in providing an optimal reflection of the transverse wave at the overall reflective portion E of the acoustic resonator.

To overcome the above disadvantage, in the acoustic resonator according to the present example, cross-sectional areas of the reflective layer 170 in the second section A2 and the first section A1 are different from each other. The sectional area of the second section A2 may be configured to maximize the reflection of the transverse wave in consideration of size, thickness, materials, and the like, of the connection electrode 125a. Thus, the reflection of the transverse wave may also be maximized in a portion in which the connection electrode 125a is disposed.

In the present example, the width of the second section A2 is not dependent on the width of the first section A1, and is defined only in consideration of a structure in which the connection electrode 125a is connected to the resonant region S. Accordingly, when the reflection of the transverse wave is greater in the second section A2 than in the first section A1 while the projection 171b is not present, the width of the reflective layer 170 may be narrower in the second section A2 than in the first section A1. Moreover, various modifications may be made, such as first section A1 and the second section A2 having a same width, but being made of different materials.

The present disclosure is not limited to the present example, and various modifications may be made.

Figure 3:
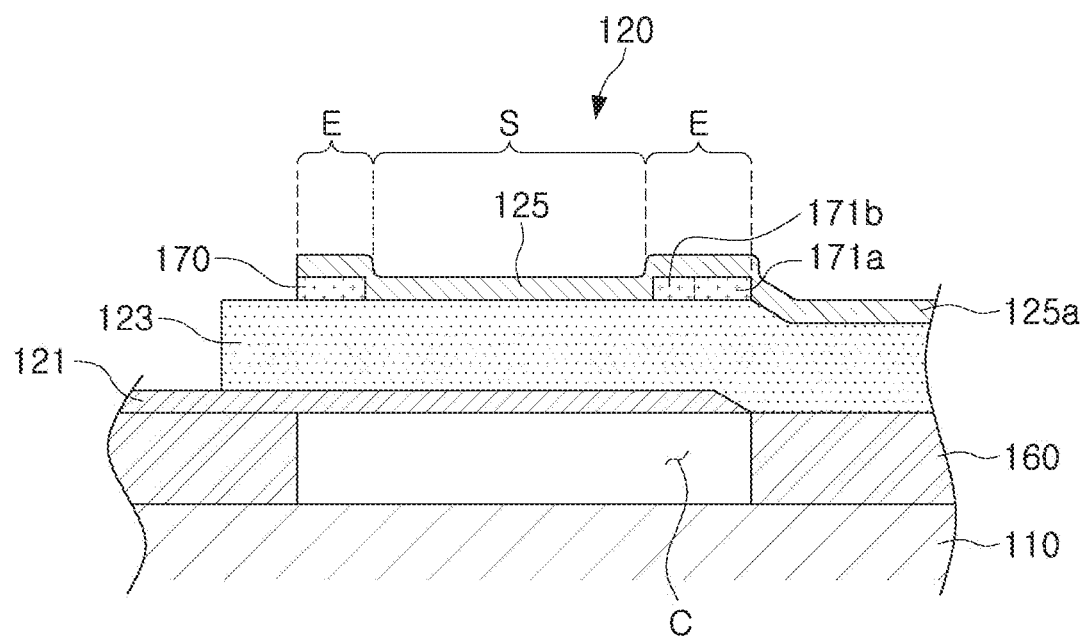
FIGS. 3 and 4 are cross-sectional views of acoustic resonators according to other examples, respectively.
Figure 4:
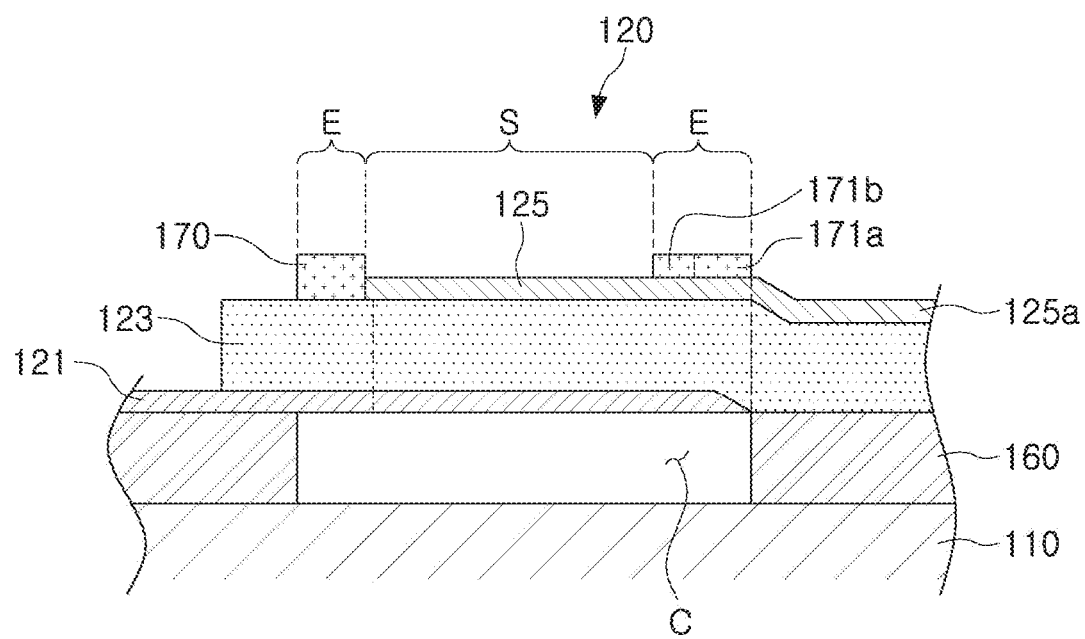

FIGS. 3 and 4 are cross-sectional views of acoustic resonators according to other examples, respectively.

Referring now to FIG. 3, an example of an acoustic resonator includes a reflective layer 170 which is disposed between a second electrode 125 and a piezoelectric layer 123. The acoustic resonator may be fabricated by forming the second electrode 125 after forming the reflective layer 170 on the piezoelectric layer 123 during the fabrication process.

Accordingly, the second electrode 125 is disposed on the reflective layer such that a reflective portion E is formed in a shape that is risen in correspondence with the shape of the reflective layer 170.

The acoustic resonator according to the example of FIG. 3 has the same planar shape as the acoustic resonator shown in FIG. 1, but differs with respect to a position in which the reflective layer 170 is disposed.

Referring now to FIG. 4, an example of an acoustic resonator includes a reflective layer 170 disposed outwardly of a second electrode 125. Accordingly, a first area A1 is stacked on the piezoelectric layer 123 and is disposed to be in contact with the end of the second electrode 125, to thereby be connected to the second electrode 125.

In this case, the reflective layer 170 disposed in the first section A1 may have a thickness different from a thickness of the reflective layer 170 disposed in the second section A2. In the example of FIG. 4, a thickness of the reflective layer 170 disposed in the first section A1 is equal to the sum of a thickness of the second electrode 125 disposed in the first section A2 and a thickness of the second electrode 125. However, the example is not limited thereto.

The reflective layer 170 disposed in the second section A2 is disposed above the second electrode 125. However, a position in which the reflective layer 170 is disposed is not limited thereto. The reflective layer 170 may be disposed below the second electrode 125, as shown in the example of FIG. 3.

Figure 5:
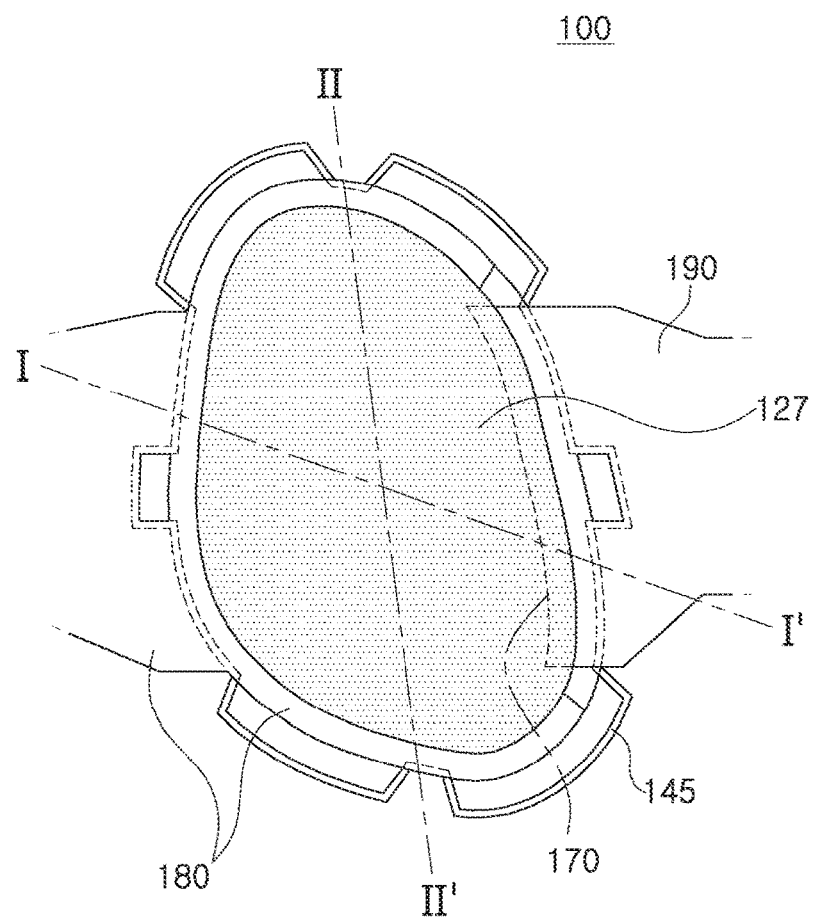
FIG. 5 is a plan view of an example of an acoustic resonator according to another example.
Figure 6:
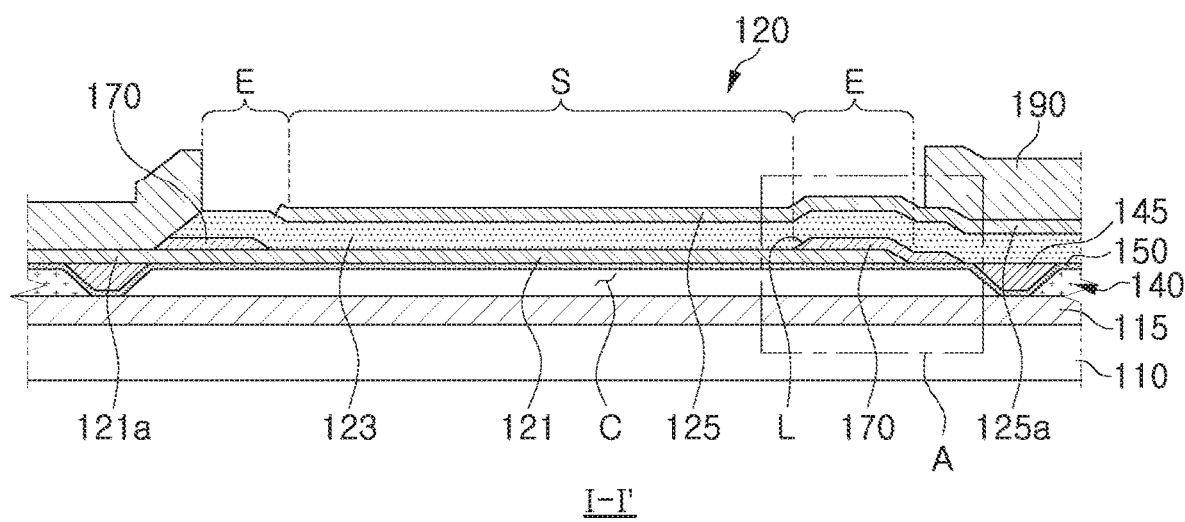
FIG. 6 is a cross-sectional view taken along line I-I' in FIG. 5.
Figure 7:
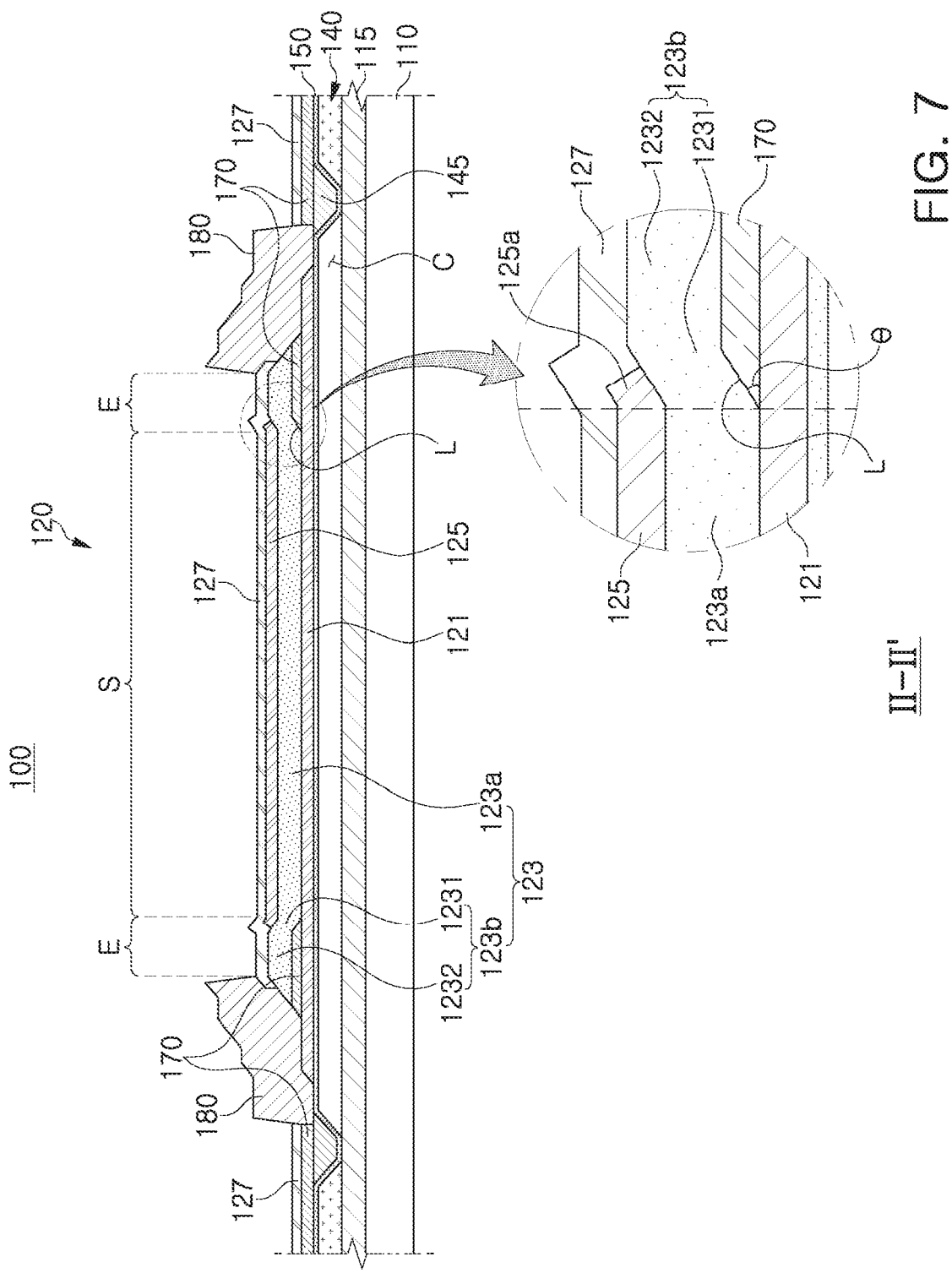
FIG. 7 is a cross-sectional view taken along line II-II' in FIG. 5.
Figure 8:
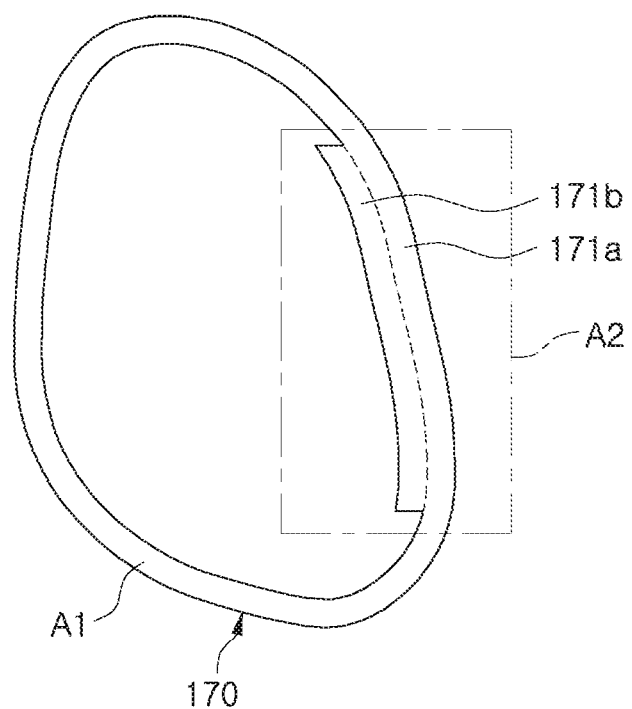
FIG. 8 is a plan view of an example of a reflective layer of the acoustic resonator shown in FIG. 5.
Figure 9:
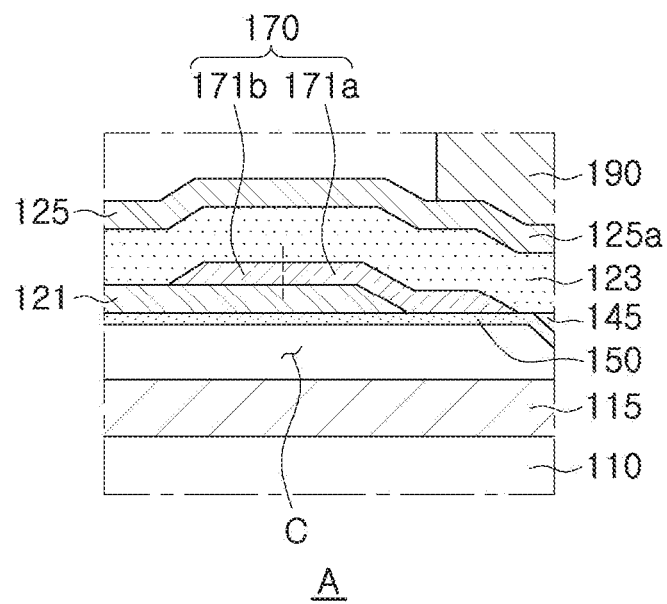
FIG. 9 is an enlarged view of portion 'A' in FIG. 6.

FIG. 5 is a plan view of an example of an acoustic resonator. FIG. 6 is a cross-sectional view taken along line I-I' in FIG. 5, while FIG. 7 is a cross-sectional view taken along line II-II' in FIG. 5. FIG. 8 is a plan view of a reflective layer of the example of the acoustic resonator shown in FIG. 5, and FIG. 9 is an enlarged view of portion 'A' in FIG. 6.

Referring to FIGS. 5 to 9, an example of an acoustic resonator may be a bulk acoustic wave (BAW) resonator and may include a substrate 110, a sacrificial layer 140, a resonant portion 120, and a reflective layer 170.

The substrate 110 may be a silicon substrate. For example, a silicon wafer or a silicon-on-insulator (SOI) substrate may be used as the substrate 110.

An insulating layer 115 may be provided on a top surface of the substrate 110 to electrically insulate the substrate 110 and the resonant portion 120 from each other. In addition, the insulating layer 115 prevents the substrate 110 from being etched by an etching gas when a cavity C is formed during an acoustic resonator fabrication process.

In this case, the insulating layer 115 may be formed of at least one of silicon dioxide ($SiO_2$), silicon nitride ($Si_3N_4$), aluminum oxide ($Al_2O_3$), and aluminum nitride (AlN). The insulating layer 115 may be provided on the substrate 110 by means of one of chemical vapor deposition (CVD) and RF magnetron sputtering.

The sacrificial layer 140 is provided on the insulating layer 115, and a cavity C and an etch-stop layer 145 are disposed in the sacrificial layer 140.

The cavity C is formed as an empty space and may be formed by removing a portion of the sacrificial layer 140.

As the cavity is formed in the sacrificial layer 140, the resonant portion 120 formed above the sacrificial layer 140 may be entirely flat.

The etch-stop layer 145 is disposed along the boundary of the cavity C. The etch-stop layer 145 is provided to prevent etching from proceeding into a cavity region during formation of the cavity C. Thus, a horizontal area of the cavity C is defined by the etch-stop layer 145 and a vertical area of the cavity C is defined by a thickness of the sacrificial layer 140.

A side surface of the etch-stop layer 145 is inclined to prevent an abrupt step from being formed at the boundary between the etch-stop layer 145 and the sacrificial layer 140. A bottom width of a pattern formed by the etch-stop layer 145 may be reduced to prevent dishing from occurring.

A membrane layer 150 is provided on the sacrificial layer 140 to define a thickness (or height) of the cavity C. Accordingly, the membrane layer 150 is also formed of a material that may not be easily removed during the formation of the cavity C.

For example, when a halide-based etching gas, such as fluorine (F) or chlorine (Cl), is used to remove a portion of the sacrificial layer 140 (e.g., the cavity region), the membrane layer 150 may be formed of a material having low reactivity with the etching gas. In this case, the membrane layer 150 may include at least one of silicon dioxide ($SiO_2$) and silicon nitride ($Si_3N_4$).

The membrane layer 150 may include a dielectric layer including at least one of magnesium oxide (MgO), zirconium oxide (ZrO2), aluminum nitride (AlN), lead zirconate titanate (PZT), gallium arsenide (GaAs), hafnium oxide ($HfO_2$) (Al), nickel (Ni), chromium (Cr), platinum (Pt), and gallium (Ga). Alternatively, the membrane layer 150 may include a metal layer including at least one of aluminum (Al), nickel (Ni), chrome (Cr), platinum (Pt), gallium (Ga), and hafnium (Hf). However, the material of the membrane layer 150 is not limited to the above materials.

The resonant portion 120 includes a first electrode 121, a piezoelectric layer 123, and a second electrode 125, sequentially stacked from bottom (substrate side) to top. That is, the piezoelectric layer 123 is disposed between the first electrode 121 and the second electrode 125.

The resonant portion 120 is provided on the membrane layer 150. As a result, the membrane layer 150, the first electrode 121, the piezoelectric layer 123, and the second electrode 125 are sequentially stacked on the substrate 110 to constitute the resonant portion 120.

The resonant portion 120 may resonate the piezoelectric layer 123 according to a signal applied to the first electrode 121 and the second electrode 125 to generate a resonance frequency and an antiresonance frequency.

The resonant portion 120 may be divided into a resonant region S in which the first electrode 121, the piezoelectric layer 123, and the second electrode 125 are stacked roughly flat and a reflective portion E in which the reflective layer 170 is interposed between the first electrode 121 and the piezoelectric layer 123.

The resonant region S is a region disposed in the center of the resonant portion 120, and the reflective portion E is a region disposed along the periphery of the resonant region S. Accordingly, the reflective portion E is a region extending outwardly from the resonant region S and refers to a region formed in a continuous annular shape along the periphery of the resonant region S. However, the reflective portion E may be formed in a discontinuous annular shape in which it is partially disconnected.

Accordingly, as shown in FIGS. 6 and 7, reflective portions E are disposed at opposite ends of the resonant region S in a section in which the resonant portion 120 is cut to cross the resonant region S, respectively.

In the present example, the reflective layer 170 includes an inclined surface (L in FIG. 7) that results in the reflective layer becoming thicker as a distance from the resonant region S increases.

In the reflective portion E, the piezoelectric layer 123 and the second electrode 125 are disposed above the reflective layer 170. Thus, both the piezoelectric layer 123 and the second electrode 125 disposed in the reflective portion E have inclined surfaces corresponding to the shape of the reflective layer 170.

In the present example, the reflective layer 170 is entirely disposed in the reflective portion E. Accordingly, as shown in FIG. 7, the reflective layer 170 is disposed within both the reflective portions E disposed at opposite ends of the resonant region S in a section in which the resonant portion 120 is cut to cross the resonant region S.

In the present example, the reflective portion E is included in the resonant portion 120. Thus, resonance may also be formed in the reflective portion E. However, the present disclosure is not limited thereto and resonance may not be formed in the reflective portion E, and may be formed only in the resonant region S.

In the present example, a case in which the reflective layer 170 is disposed between the piezoelectric layer 123 and the first electrode 121 has been described. However, various modifications may be made, such as disposing the reflective layer 170 below the first electrode 121 or in the piezoelectric layer 123.

The first electrode 121 and the second electrode 125 may be formed of a conductive material, e.g., gold, molybdenum, ruthenium, iridium, aluminum, platinum, titanium, tungsten, palladium, tantalum, chromium, nickel, a metal including at least one thereof or alloys thereof. However, the conductive material of the first and second electrodes 121 and 125 are not limited to the above materials.

In the resonant portion 120, the first electrode 121 is configured to have a larger area than the second electrode 125, and a first metal layer 180 is provided on the first electrode 121 along the outer edge of the first electrode 121. Thus, the first metal layer 180 may be disposed to surround the second electrode 125.

Since the first electrode 121 is disposed on the membrane layer 150, it is entirely flat. On the other hand, since the second electrode 125 is disposed on the piezoelectric layer 123, it may have a bent portion corresponding to a shape of the piezoelectric layer 123. That is, the second electrode 125 may include a region disposed outside of the resonant region S may have a bent portion following the shape of the reflective layer 170 or the piezoelectric layer 123.

The first electrode 121 may be divided into a portion disposed within the resonant portion 120 and a portion 121a disposed outside of the resonant portion 120 according to a placement area. The portion 121a disposed outside the resonant portion 120 may be a connection electrode connected to another adjacent acoustic resonator.

The second electrode 125 is entirely disposed in the resonant region S and is partially disposed at the reflective portion E. Thus, the second electrode 125 may be divided into a portion disposed on a piezoelectric portion 123a of the piezoelectric layer and a portion disposed on a bent portion 123b of the piezoelectric layer 123 (the piezoelectric portion 123a and the bent portion 123b will be described later).

More specifically, in the present example, the second electrode 125 is disposed to cover the entirety of the piezoelectric portion 123a and to partially cover an inclined portion of the piezoelectric layer 123. Accordingly, the second electrode (125a in FIG. 7) disposed in the reflective portion E is configured to have a smaller area than an inclined surface of the inclined portion 1231. In the resonant portion 120, the second electrode 125 is configured to have a smaller area than the piezoelectric layer 123.

Accordingly, as shown in FIGS. 6 and 7, an end of the second electrode 125 is disposed within the reflective portion E in a section in which the resonant portion 120 is cut to cross the resonant region S. At least a portion of the end of the second electrode 125 disposed in the reflective portion E is disposed to overlap the reflective layer 170. The expression "overlap" means that when the second electrode 125 is projected onto a plane on which the reflective layer 170 is disposed, a portion of the second electrode 125, projected onto the plane, overlaps the reflective layer 170.

According to the placement area, the second electrode 125 may also be divided into a portion disposed within the resonant region 120 and a portion disposed outside of the resonant portion 120. The portion of the second electrode disposed outside of the resonant portion 120 may be a connection electrode 125a connected to another adjacent acoustic resonator. A metal layer 190 may be provided on the connection electrode 125a.

In the present example, the second electrode 125 is partially disposed within the reflective portion E. However, the second electrode 125 may be disposed in the entirety of the reflective portion E or may not be disposed at all in the reflective portion E.

The piezoelectric layer 123 is provided on the first electrode 121 and a reflective layer 170 will be described below.

Zinc oxide (ZnO), aluminum nitride (AlN), doped aluminum nitride, lead zirconate titanate, quartz, and the like, may be selectively used as a material of the piezoelectric layer 123. The doped aluminum nitride may further include a rare earth metal, a transition metal or an alkaline earth metal. As an example, the rare earth metal may include at least one of scandium (Sc), erbium (Er), yttrium (Y), and lanthanum (La). The transition metal may include at least one of hafnium (Hf), titanium (Ti), zirconium (Zr), tantalum (Ta), and niobium (Nb). The alkaline earth metal may include magnesium (Mg).

The piezoelectric layer 123 according to the present example includes the piezoelectric portion 123a disposed in the resonant region S and the bent portion 123b disposed on the reflective portion E.

The piezoelectric portion 123a is a portion that is directly stacked on a top (resonant region S side) surface of the first electrode 121. Thus, the piezoelectric portion 123a is interposed between the first electrode 121 and the second electrode 125 to be flat with the first electrode 121 and the second electrode 125.

The bent portion 123b may extend from the piezoelectric portion 123a externally to be a region disposed within the reflective portion E.

The bent portion 123b is disposed on the reflective layer 170 and is formed to rise in correspondence with a shape of the reflective layer 170. Thus, the piezoelectric layer 123 is bent at the boundary between the piezoelectric portion 123a and the bent portion 123b, and the bent portion 123b rises corresponding to a thickness and a shape of the reflective layer 170.

The bent portion 123b may be divided into the inclined portion 1231 and an extending portion 1232.

The inclined portion 1231 is a portion formed to be inclined along the inclined surface L of the reflective layer 170. The extending portion 1232 is a portion extending from the inclined portion 1231 to the outside, away from the resonant region S.

The inclined portion 1231 may be formed to be level with the inclined surface L of the reflective layer 170, and an inclination angle of the inclined portion 1231 may be equal to that of the inclined surface L of the reflective layer 170.

The reflective layer 170 is disposed along a surface formed by the membrane layer 150, the first electrode 121, and the etch-stop layer 145.

The reflective layer 170 is disposed around the resonant region S to support the bent portion 123b of the piezoelectric layer 123. Thus, the bent portion 123b of the piezoelectric layer 123 may be divided into the inclined portion 1231 and the extending portion 1232 in correspondence with the shape of the reflective layer 170.

The reflective layer 170 is disposed in a region that does not overlap the resonant region S. For example, the reflective layer 170 may be disposed in the whole or a portion of the region on the substrate 110, except for a region that overlaps the resonant region.

In the present example, the reflective layer 170 disposed within the resonant portion 120 is configured to have a continuous annular shape, as shown in FIG. 8. However, the present disclosure is not limited thereto. Various modifications may be made, such as forming the reflective layer 170 disposed within the resonant portion 120 to have a partially cut annular shape.

At least portion of the reflective layer 170 is disposed between the piezoelectric layer 123 and the first electrode 121.

A side surface of the reflective layer 170 disposed along the boundary of the resonant region S becomes thicker as a distance from the resonant region S increases. Thus, the reflective layer 170 is formed as the inclined surface L in which a side adjacent to the resonant region S has an inclination angle θ. Hereinafter, the inclination angle θ of the reflective layer 170 is an angle between the inclined surface L of the reflective layer 170 disposed adjacent to the resonant region S and a bottom surface of the reflective layer S.

When an inclination angle θ of the reflective layer 170 is made smaller than 5 degrees, a thickness of the reflective layer 170 would need to be made very small or an area of the inclined surface L would need to be made excessively large to manufacture the acoustic resonator. Hence, there is difficulty in its substantial implementation.

When the inclination angle θ of the reflective layer 170 is made greater than 70 degrees, an inclination angle of the inclined portion 1231 of the piezoelectric layer 123 stacked on the reflective layer 170 is also made greater than 70 degrees. In this case, since the piezoelectric layer 123 is excessively bent, a crack may occur at the bent portion of the piezoelectric layer 123.

For the above reason, in the present example, the inclination angle θ of the inclined surface L ranges from 5 to 70 degrees.

The reflective layer 170 may be formed of a dielectric material, such as silicon oxide ($SiO_2$), aluminum nitride (AlN), aluminum oxide ($Al_2O_3$), silicon nitride (SiN), magnesium oxide (MgO), zirconium oxide ($ZrO_2$), titanic acid zirconate oxide (GaAs), hafnium oxide ($HfO_2$), titanium oxide ($TiO_2$), and zinc oxide (ZnO), but is formed of a material different from that of the piezoelectric layer 123. A region including the reflective layer 170 may be formed as an air, which may be implemented by removing the reflective layer 170 after forming the resonant portion 120.

In the present example, the thickness of the reflective layer 170 may be equal to or relatively similar to a thickness of the first electrode 121. In addition, the thickness of the reflective layer 170 may be relatively similar to or smaller than a thickness of the piezoelectric layer 123. For example, the thickness of the reflective layer 170 may be greater than or equal to 100 angstroms (Å). In this case, deposition thickness may be readily adjusted and thickness uniformity in a deposited wafer may be secured. The thickness of the reflective layer 170 may be smaller than that of the piezoelectric layer 123. Accordingly, an inclined portion of the piezoelectric layer 123 may be formed by the reflective layer 170, and a crack or the like may be prevented from occurring at the piezoelectric layer 123. This may contribute to enhancement of resonator performance.

The resonant portion 120 is spaced apart from the substrate 110 through the cavity C formed as an empty space.

The cavity C may be protected by supplying an etching gas (or an etchant) to remove the sacrificial layer 140 disposed in the cavity C during fabrication of the acoustic resonator 100.

The protective layer 127 is disposed along a surface of the acoustic resonator 100 to protect the acoustic resonator 100 from external factors. The protective layer 127 may be disposed along a surface formed by the second electrode 125, the bent portion 123b of the piezoelectric layer 123, and the reflective layer 170.

The protective layer 127 may be formed of any one of insulating materials of silicon-oxide-based, silicon-nitride-based, aluminum-oxide-based, and aluminum-nitride-based, but is not limited thereto.

The first electrode 121 and the second electrode 125 include connection electrodes 121a and 125a connected outwardly of the resonant portion 120, respectively. A first metal layer 180 is provided on a top surface of the connection electrode 121a of the first electrode 121, and a second metal layer 190 is provided on a top surface of the connection electrode 125a of the second electrode 125.

The first metal layer 180 and the second metal layer 190 may be formed of gold (Au), a gold-tin (Au—Sn) alloy, copper (Cu), a copper-tin (Cu—Sn) alloy, aluminum (Al), and an aluminum-copper (Al—Cu) alloy.

Although FIG. 2 illustrates a case in which the reflective layer 170 is also disposed below the connection electrode 125a of the second electrode 125, the configuration of the present disclosure is not limited thereto and the reflective layer 170 may be removed below the connection electrode 125a of the second electrode 125.

The above-configured acoustic resonator is divided into a second section A2 in which the reflective layer 170 is disposed along the boundary between the connection electrode 125a of the second electrode 125 and the resonant region S, and a first section A1 disposed in a region that does not include the second section A2.

In the second section A2, the reflective layer 170 includes a reference portion 171a extending with the same or relatively similar width as the first section A1 and a projection 171b protruding to the center of the resonant region S from the reference portion 171a.

The projection 171b protrudes to the center of the resonant region S in such a manner as to expand the width of the reflective layer 170 over the entire boundary between the second electrode 125 and the connection electrode 125a.

Accordingly, a width of the reflective layer 170 in the second section A2 is different from a width of the reflective layer 170 in the first section A1. In the present example, the width of the reflective layer 170 in the second section A2 is greater than the width of the reflective layer 170 in the first section A1. However, the present disclosure is not limited thereto and many modifications may be made, such as forming the first section A1 and the second section to have the same width, but with different materials.

As discussed above, the present disclosure is not limited to the above-described configuration, and the width of the reflective layer 170 in the second section A2 may be smaller than the width of the reflective layer 170 in the first section A1 according to a reflection of a transverse wave. In addition, various modifications may be made, such as forming the first section A1 and the second section A2 to have same width, but with different materials.

In the examples of acoustic resonators, a first section and a second section of a reflective portion have different structures. Accordingly, since transversal vibrations are effectively prevented from being propagated externally, performance of the acoustic resonator may be enhanced.

Figure 10A:
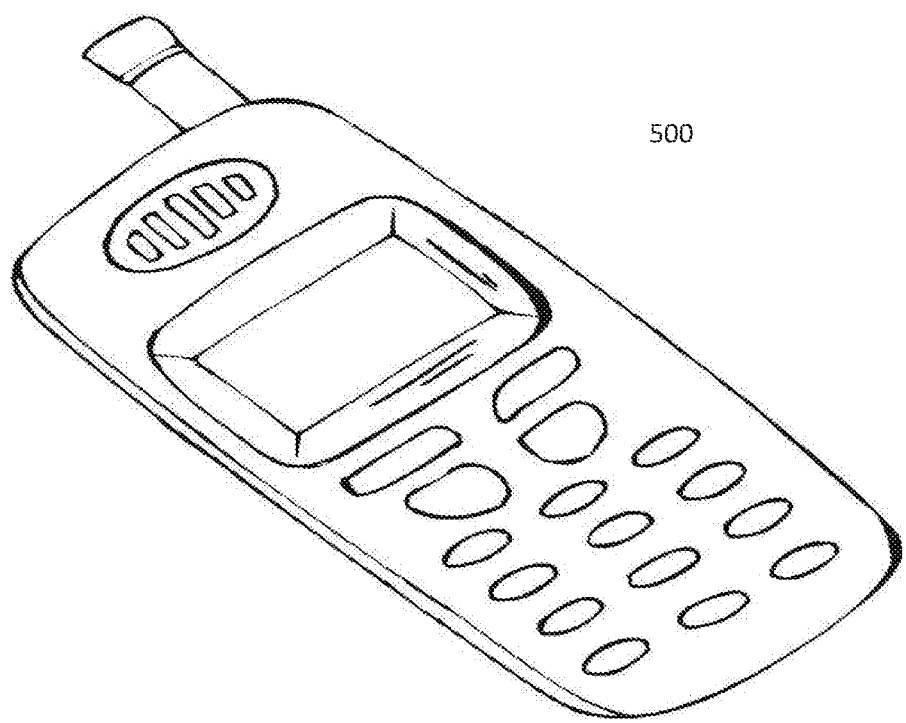
FIG. 10A is a perspective view of an example of an apparatus that may utilize an acoustic resonator.
Figure 10B:
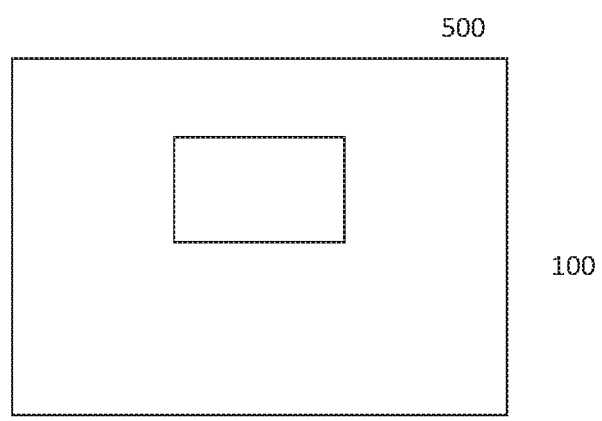
FIG. 10B is a block diagram of an example of an apparatus including an acoustic resonator.

FIG. 10A shows an example of an apparatus 500, such as a mobile communication device, that may utilize one or more of the examples of acoustic resonators disclosed herein. Further, FIG. 10B shows an example of the apparatus 500 including an acoustic resonator 100.

As described above, an acoustic resonator according to various examples includes a reflective layer divided into a first section and a second section having different structures and formed of different materials. Accordingly, since transversal vibrations are effectively prevented from being propagated externally, performance of the acoustic resonator may be enhanced.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator comprising:
a substrate;
a resonant region including a first electrode, a piezoelectric layer, and a second electrode disposed on the substrate, and a reflective layer disposed along a periphery of the resonant region; and
a connection electrode extending from the second electrode,
wherein
the reflective layer includes a second section disposed between the resonant region and the connection electrode, and a first section disposed outside of a region in which the connection electrode extends, and
a cross-sectional area of the first section is different than a cross-sectional area of the second section.

2. The acoustic resonator of claim 1, wherein
the first section and the second section have a same thickness, and
the second section includes a reference portion and a projection protruding from the reference portion toward a center of the resonant region.

3. The acoustic resonator of claim 2, wherein the projection protrudes from the reference portion along a boundary between a resonant portion, which includes the resonant region, and the connection electrode.

4. The acoustic resonator of claim 1, wherein the second section of the reflective layer has a greater width than the first section of the reflective layer.

5. The acoustic resonator of claim 1, wherein at least a portion of the reflective layer is disposed between the first electrode and the piezoelectric layer.

6. The acoustic resonator of claim 5, wherein the second electrode has an end disposed within a reflective portion, which includes the reflective layer.

7. The acoustic resonator of claim 6, wherein the reflective layer is formed of a material different from a material of which the piezoelectric layer is formed.

8. The acoustic resonator of claim 1, wherein the reflective layer is laminated on a side of the second electrode that is opposite of the substrate.

9. The acoustic resonator of claim 8, wherein the first section of the reflective layer is laminated on the piezoelectric layer and is disposed to be in contact with an end of the second electrode.

10. The acoustic resonator of claim 9, wherein the reflective layer is configured to have a first thickness in the first section that is different from a second thickness in the second section.

11. The acoustic resonator of claim 1, wherein the reflective layer is disposed between the piezoelectric layer and the second electrode.

12. The acoustic resonator of claim 1, wherein the reflective layer is configured to have a continuous annular shape.

13. The acoustic resonator of claim 1, wherein the reflective layer is formed of a material different from a material of which the piezoelectric layer is formed.

14. An acoustic resonator comprising:
a substrate; and
a resonant region including a first electrode, a piezoelectric layer, and a second electrode laminated on the substrate, and a reflective layer is disposed along a periphery of the resonant region in an annular shape,
wherein the reflective layer is disposed between the piezoelectric layer and the substrate, and the reflective layer includes a first section having a first width and a second section having a second width that is different than the first width.

15. The acoustic resonator of claim 14, wherein the second section of the reflective layer comprises a projection protruding toward a center of the resonant region.

16. An apparatus comprising:
an acoustic resonator including:
a first electrode,
a piezoelectric layer above the first electrode,
a second electrode above the piezoelectric layer,
a reflective layer disposed along a periphery of a resonant region in which the first electrode, the piezoelectric layer, and the second electrode are stacked, and
a connection electrode extending from the second electrode,
wherein the reflective layer comprises a first material in a first section and a comprises a second material in a second section corresponding to a boundary between the connection electrode and the second electrode, the first material being different than the second material.

17. The apparatus of claim 16, wherein the first section of the reflective layer has a first width and the second section of the reflective layer has a second width, the first width being different than the second width.

18. The apparatus of claim 16, wherein the periphery of the resonant region is outside of the resonant region.

* * * * *